(12) United States Patent
Yu

(10) Patent No.: US 7,632,734 B2
(45) Date of Patent: Dec. 15, 2009

(54) METHOD OF FABRICATING SEMICONDUCTOR DEVICE

(75) Inventor: Chen-Hua Yu, Hsinchu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 326 days.

(21) Appl. No.: 11/730,542

(22) Filed: Apr. 2, 2007

(65) Prior Publication Data

US 2008/0242019 A1 Oct. 2, 2008

(51) Int. Cl.
*H01L 21/8234* (2006.01)

(52) U.S. Cl. .................. 438/275; 438/195; 438/283; 438/306; 257/E21.045; 257/E21.159; 257/E21.179

(58) Field of Classification Search .................. 438/195, 438/209, 277, 518, 588; 257/E21.045, E21.061, 257/E21.1, E21.159, E21.177, E21.179, E21.4, 257/E21.457
See application file for complete search history.

(56) References Cited

U.S. PATENT DOCUMENTS

| | | | |
|---|---|---|---|
| 5,736,440 A | 4/1998 | Manning | |
| 5,926,706 A * | 7/1999 | Liaw et al. | 438/238 |
| 5,930,615 A | 7/1999 | Manning | |
| 6,127,212 A | 10/2000 | Chen et al. | |
| 6,291,325 B1 | 9/2001 | Hsu | |
| 6,967,384 B2 | 11/2005 | Beintner et al. | |
| 2003/0102503 A1* | 6/2003 | Rabkin et al. | 257/315 |

\* cited by examiner

*Primary Examiner*—Savitri Mulpuri
*Assistant Examiner*—Cheung Lee
(74) *Attorney, Agent, or Firm*—Birch, Stewart, Kolasch & Birch, LLP

(57) ABSTRACT

A method of fabricating a semiconductor device is disclosed. The method of fabricating a semiconductor device provides a semiconductor substrate. A gate dielectric layer is formed on the semiconductor substrate. A first conductive layer is formed on the gate dielectric layer, wherein the first conductive layer is an in-situ doped conductive layer. A second conductive layer is formed on the first conductive layer. The second conductive layer and the first conductive layer are patterned to form a gate electrode.

20 Claims, 8 Drawing Sheets

METHOD OF FABRICATING SEMICONDUCTOR DEVICE

BACKGROUND OF THE INVENTION

1. Field of the Invention

The invention relates to a method of fabricating a semiconductor device, and in more particularly relates to a method for fabricating a gate electrode of a semiconductor device having reduced polysilicon gate depletion.

2. Description of the Related Art

Semiconductor devices such as field effect transistors (FETs) are increasingly being used in low voltage applications. As semiconductor devices are fabricated to have a higher degree of integration, a faster operating speed, and lower power consumption, the magnitude or size of a complementary metal-on semiconductor field effect transistor (CMOSFET, hereafter referred to as "CMOS") included in the device is rapidly reduced. As CMOS devices are scaled to smaller and smaller dimensions, manufacturers must refine transistor designs to maintain optimum device performance.

The conventional method of fabricating CMOS devices comprises polysilicon layers doped by impurity implantation to form polysilicon gate electrodes such as NMOS or PMOS gate electrodes. If the polysilicon gate electrode is over-implanted with dopants such as arsenics or boron, a complete conductor is not formed and polysilicon gate depletion increases. During operation of the MOS transistor, a depletion region may thus arise due to depletion of electric charge at an interface between the gate oxide layer and the substrate. The depletion region of the polysilicon gate has a magnitude of several angstroms (Å) and acts as a connected gate oxide layer capacitor. If the thickness of a gate oxide layer is small, the characteristics such as device current of the transistor are poor due to the polysilicon-gate-depletion region.

Structures and fabrication methods have therefore been explored to solve the above-discussed problems. U.S. Patent No. 2006/0030109 describes a method for producing highly doped polysilicon thin films as shown in FIG. 1. In the conventional process a bi-layer polysilicon gate electrode 226 for an n-type device comprising a lower highly doped n-type polysilicon film 222 and an upper n-type polysilicon gate electrode 240 is fabricated along with the formation of a n-type source/drain region 242. A highly doped bi-layer polysilicon gate electrode 228 for a p-type device comprising a lower highly doped p-type polysilicon film 220 and an upper p-type polysilicon film 244 is fabricated along with the formation of a p-type source/drain region 246. A high temperature or long duration annealing process is not required to drive the gate electrode/gate dielectric interface. A lower energy and heavy implantation process is difficult to control. The penetration of dopants through the gate oxide must be improved.

U.S. Pat. No. 6,930,362 B1 discloses a calcium doped polysilicon gate electrode for PMOS containing semiconductor devices. The physical/chemical attraction between calcium and boron inhibits movement of boron out of the polysilicon gate electrode material, thereby reducing boron penetration and polysilicon depletion problems and also improving device performance. An additional calcium implantation process and an appropriate calcium/boron ratio are thus required in the PMOS fabricating process.

Thus, a novel and reliable method of fabricating a gate electrode of a semiconductor device for reducing polysilicon gate depletion is desirable.

BRIEF SUMMARY OF INVENTION

A detailed description is given in the following embodiments with reference to the accompanying drawings.

To solve the above-described problems, a method for fabricating a semiconductor device is provided. An exemplary embodiment of a method for fabricating a semiconductor device comprises: providing a semiconductor substrate; forming a gate dielectric layer on the semiconductor substrate; forming a first in-situ doped conductive layer on the gate dielectric layer; forming a second conductive layer on the first in-situ doped conductive layer; and patterning the second conductive layer and the first in-situ doped conductive layer to form a gate electrode.

An exemplary embodiment of a method for fabricating a CMOS device comprises: forming an gate dielectric layer in a first device region and a second device region in a semiconductor substrate; forming a patterned first in-situ doped conductive layer with a first type conductivity on the gate dielectric layer on the first device region; blanketly forming a third conductive layer; patterning the third conductive layer and the patterned first in-situ doped conductive layer on the first device region to form a first gate electrode; patterning the third conductive layer on the second device region to form a second gate electrode on the second device region.

Another exemplary embodiment of a method for fabricating a semiconductor device comprises: providing a semiconductor substrate; forming a gate dielectric layer on the semiconductor substrate; forming a first conductive layer on the gate dielectric layer, wherein the first conductive layer is an in-situ doped conductive layer; forming an second conductive layer on the first conductive layer; patterning the second conductive layer and the first conductive layer to form a gate electrode, wherein the second conductive layer has a thickness about 80% of a thickness of the gate electrode.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
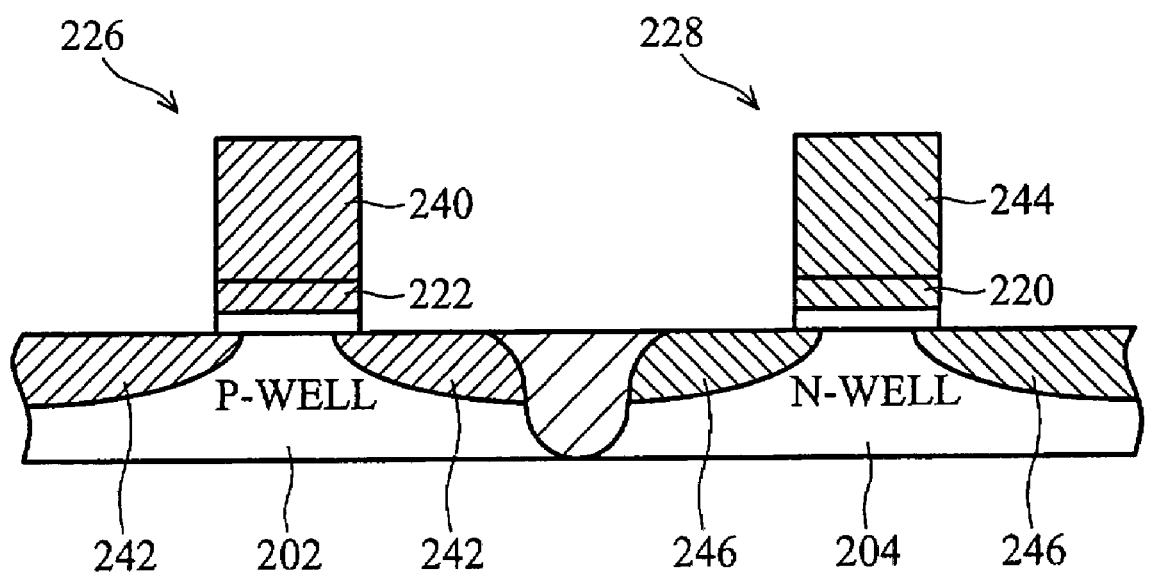
FIG. 1 shows a cross section of a conventional CMOS device.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2a to 2e and FIGS. 3a to 3g show cross sections of various embodiments of a process of fabricating a semiconductor device. Wherever possible, the same reference numbers are used in the drawing and the description to refer the same or like parts.

FIGS. 2a to 2e are cross sections showing an exemplary embodiment of a method for fabricating a MOS device 300.

Figure 2A:
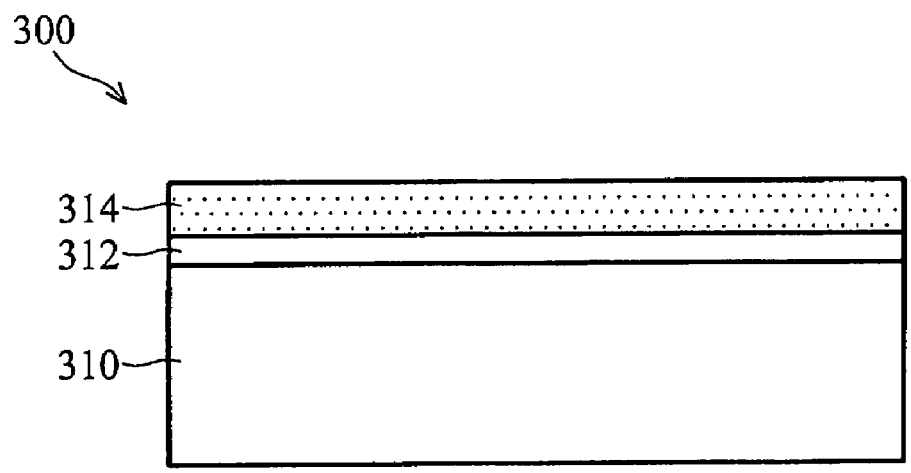
FIGS. 2a to 2e show cross sections of an exemplary method for fabricating a MOS device of the invention.

Referring to FIG. 2a, a substrate 310 is provided. The substrate 310 may comprise silicon, SiGe, bulk semiconductor, strained semiconductor, compound semiconductor, silicon on insulator (SOI), and other commonly used semiconductor substrates can be used. The substrate 310 is preferably p-type.

A gate dielectric layer 312 is deposited on a surface of the substrate 310. The gate dielectric layer 312 may be a silicon dioxide layer, a silicon oxynitride layer, or combinations thereof formed by any of the known methods, such as thermal oxidation, chemical vapor deposition (CVD) or similar. The gate dielectric layer 312 may also include high-k dielectric materials such as oxygen-containing dielectric, nitrogen-containing dielectric, or combinations thereof.

Next, a first conductive layer 314 is formed on the gate dielectric layer 312, wherein the first conductive layer 314 is an in-situ doped conductive layer. The term "in-situ doped conductive layer" means that the conductive layer is implanted with impurities in one process step without an additional implantation process step. In the implantation process step the conductive layer is formed by introducing the mixture of reactive gas and impurities in one deposition tool. The first conductive layer 314 may comprise silicon, polysilicon or amorphous silicon formed by low pressure CVD (LPCVD), atomic-layer CVD (ALCVD) or other deposition processes in an ambient containing phosphorus and silane at a temperature of about 450□ to 600□. The first conductive layer 314 has a thickness of about 3 Å to 300 Å. The first conductive layer 314 has an impurity concentration of about $10^{19}$ to $10^{21}$ ions/cm$^3$. In this embodiment, the impurities are of n-type, such as arsenic or phosphorus. In some embodiments, the thickness of the first conductive layer 314 is about 4 Å to 8 Å formed by ALCVD. In other embodiments, the thickness of the first conductive layer 314 is about 50 Å to 200 Å formed by LPCVD.

The impurity concentration of the first conductive layer 314 is higher than the conductive layer doped by implanting impurities. The first conductive layer 314 can be more easily activated than the conductive layer doped by implanting impurities.

Figure 2B:
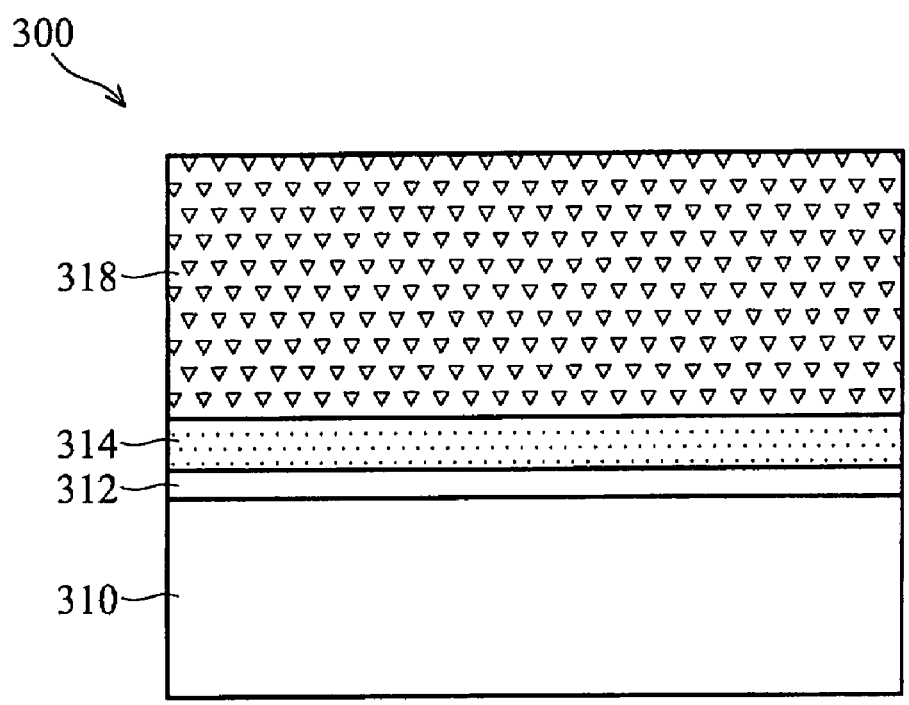

Referring to FIG. 2b, a second conductive layer 318 is formed on the first conductive layer 314. The second conductive layer 318 may be an in-situ doped conductive layer or a conductive layer doped by implanting impurities. The second conductive layer 318 may comprise silicon, polysilicon or amorphous silicon formed by low pressure CVD (LPCVD), atomic-layer CVD (ALCVD) or other deposition processes in an ambient containing silane at a temperature of about 450□ to 600□. The second conductive layer 318 may also comprise metal formed by physical vapor deposition (PVD) or other deposition processes. The second conductive layer 318 has a thickness of about 500 Å to 2500 Å. The second conductive layer 318 has an impurity concentration of about $10^{18}$ to $10^{21}$ ions/cm$^3$. In this embodiment, the impurities are of n-type, such as arsenic or phosphorus.

Figure 2C:
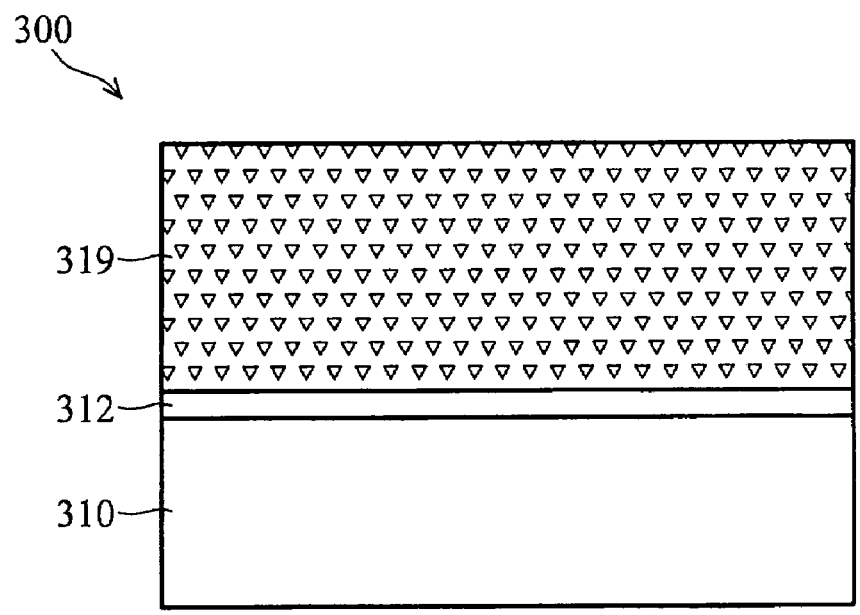

Referring to FIG. 2c, an annealing process is performed to activate the n-type impurities in the second conductive layer 318 and the first conductive layer 314 to form a doped conductive layer 319. After the annealing process, the n-type impurities are uniformly distributed in the doped conductive layer 319. The annealing is preferably performed at a temperature of about 400° C. or higher. As is known in the art, the annealing process may be performed using thermal annealing, flash annealing, laser annealing or the like. Alternatively, the annealing process may also be performed after the subsequently formed source/drain regions, or at any other time prior to saliciding of the subsequently formed source/drain regions.

Figure 2D:
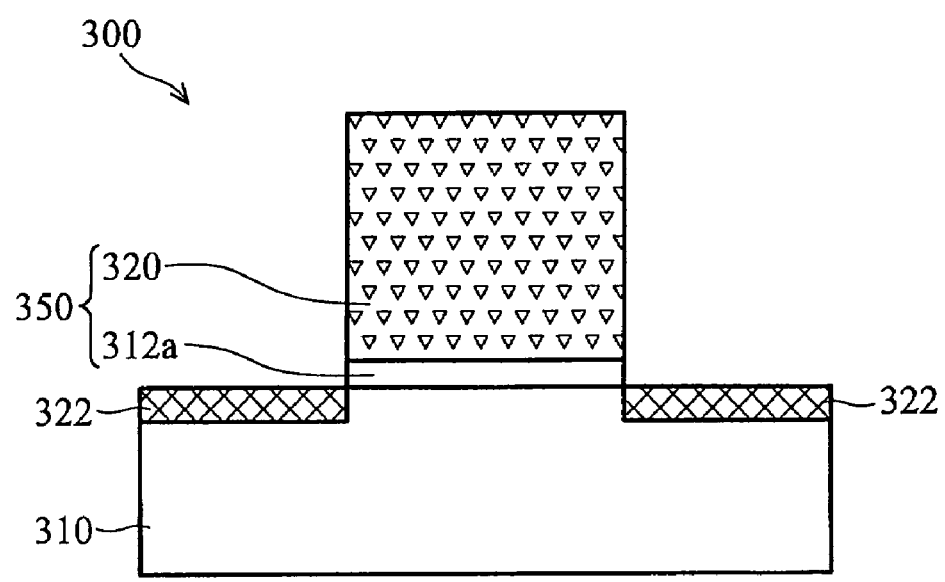

Referring to FIG. 2d, the doped conductive layer 319 is patterned to form a gate electrode 320, while the gate dielectric layer 312 is patterned to form a patterned gate dielectric layer 312a. The gate electrode 320 and the patterned gate dielectric layer 312a serve as a gate stack 350. FIG. 2d also illustrates the formation of lightly doped source/drain (LDD) regions 322. Preferably, the lightly doped source/drain regions 322 are formed by implanting n-type impurities such as arsenic or phosphorus into the substrate 310 using the gate stack 350 as a mask.

Figure 2E:
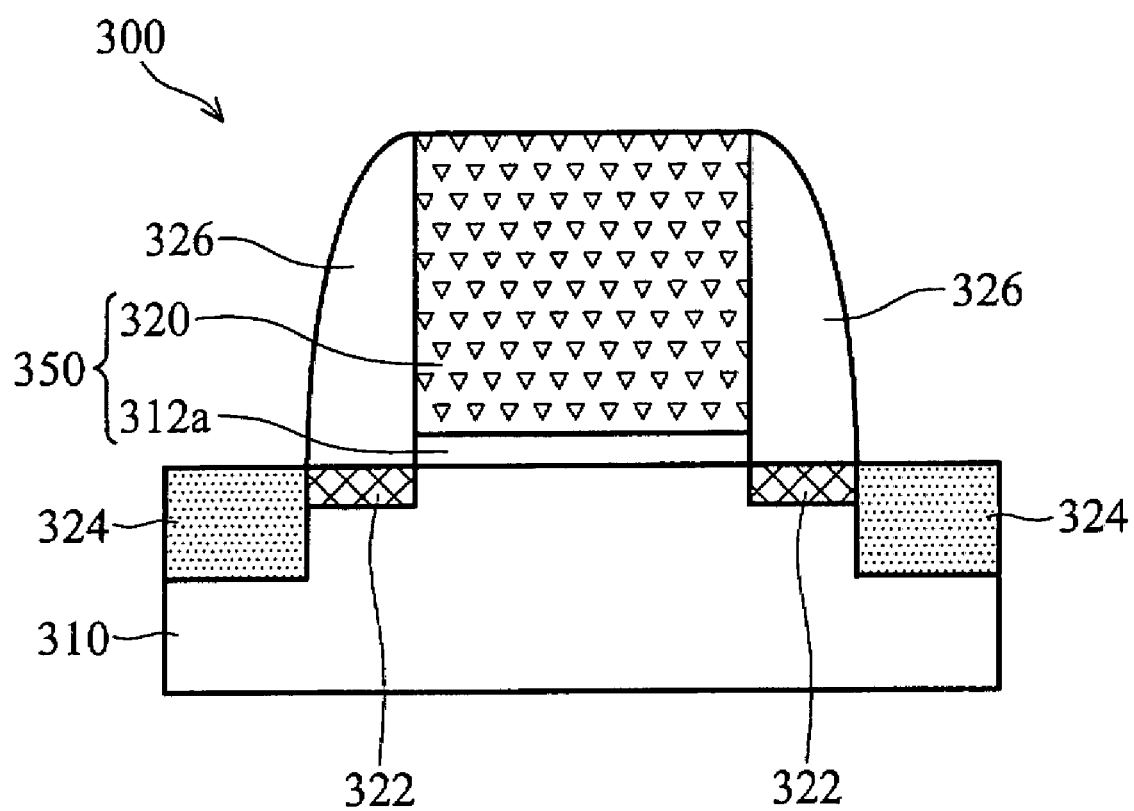

As shown in FIG. 2e a pair of spacers 326 is formed along sidewalls of the gate stack 350. As is known in the art, spacers 326 are preferably formed by blanketly depositing a dielectric layer over the entire region followed by etching back of the dielectric layer using anisotropic etching such as plasma etching. Plasma etching typically comprises fluorine such as $CHF_3$ or $CF_4$ for precisely controlling the shape and length of spacers 326. Spacers 326 may be formed of a single dielectric layer or a composite layer including more than one dielectric layer, for example, a silicon nitride layer on a silicon oxide liner (not shown) formed by LPCVD. FIG. 2e also illustrates the formation of source/drain regions 324. Preferably, the spacers 326 and the gate stack 350 are used as a mask for the source/drain implantation process. Source/drain regions 324 are then formed by implanting n-type impurities into the substrate 310. Thus, the fabrication of MOS device 300 is complete.

In the aforementioned embodiment, the MOS device 300 is a NMOS device. In other embodiments, the MOS device 300 may be a PMOS device. The substrate 310 is n-type, and the impurities in the doped conductive layer 319, the LDD regions 322 and the source/drain regions 324 are p-type.

Figure 3A:
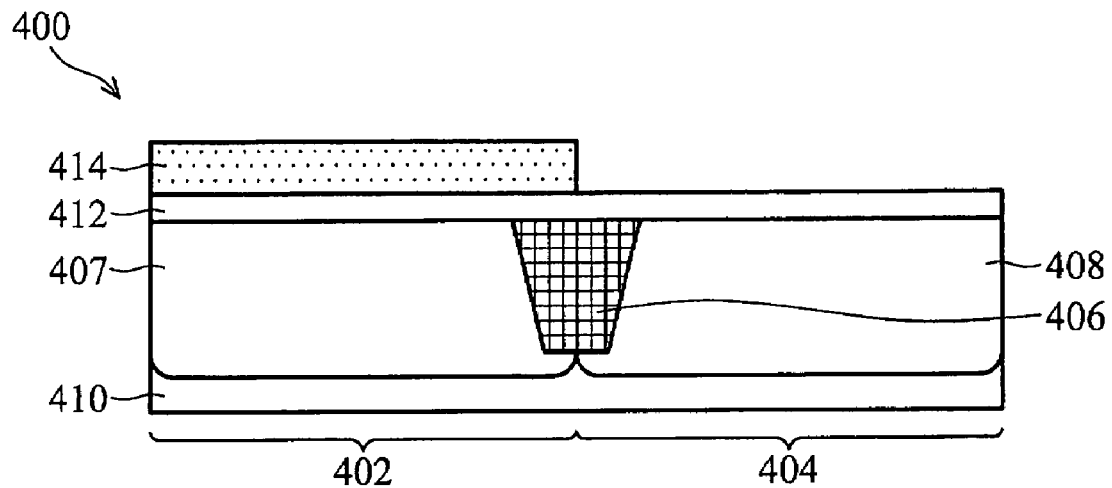
FIGS. 3a to 3g show cross sections an exemplary CMOS device fabrication in another embodiment of the invention.

FIGS. 3a to 3g are cross sections showing an exemplary embodiment of a method for fabricating a CMOS device 400 of the invention. Referring to FIG. 3a, a semiconductor substrate 410 is provided with a shallow trench isolation (STI) region 406 between a NMOS region 402 and a PMOS region 404. Substrate 410 may comprise silicon, SiGe, bulk semiconductor, strained semiconductor, compound semiconductor, silicon on insulator (SOI), and other commonly used semiconductor substrates can be used. The substrate 410 is preferably p-type. Alternatively, the substrate 410 may comprise an n-type substrate.

Preferably, the NMOS region 402 is masked by a patterned photoresist (not shown). An n-type impurity implantation process is then performed to form an N-well region 408 in the PMOS region 404. The N-well region 408 preferably comprises phosphorus and/or arsenic, which neutralizes the p-type impurities in the p-type substrate 410 and converts the implanted region to n-type. The patterned photoresist is then removed. Next, the PMOS region 404 is masked by another patterned photoresist (not shown). A p-type impurity implantation process is then performed to form a P-well region 407 in the NMOS region 402. The P-well region 407 preferably comprises boron. In some embodiments, because the NMOS region 402 is masked by the photoresist while forming the N-well region 408, the NMOS region 402 may serve as the P-well region 407 without requiring a p-type impurity implanting process.

A gate dielectric layer 412 is deposited on the entire surface of the substrate 410. The gate dielectric layer 412 may be a silicon dioxide layer, a silicon oxynitride layer, or combinations thereof. The method for forming the layer can be any of the known methods, such as thermal oxidation, chemical vapor deposition (CVD), etc. The gate dielectric layer 412 may also include high-k dielectric materials such as oxygen-containing dielectric, nitrogen-containing dielectric, or combinations thereof An in-situ doped conductive layer (not shown) is subsequently deposited on the gate dielectric layer 412. A patterned photoresist (not shown) is then formed on the first in-situ conductive layer in the PMOS region 404. The patterned photoresist is used as a mask for the following anisotropic etching. The first in-situ conductive layer in the PMOS region 404 is partially removed to form a first conductive layer 414 in the NMOS region 402, wherein the first conductive layer 414 is an in-situ doped conductive layer. The first conductive layer 414 may comprise silicon, polysilicon or amorphous silicon formed by low pressure CVD (LPCVD), atomic-layer CVD (ALCVD) or other deposition processes in an ambient containing phosphorus and silane at a temperature of about 450□ to 600═. The first conductive layer 414 has a thickness of about 3 Å to 300 Å. In one embodiment, the thickness of the first conductive layer 414 is about 4 Å to 8 Å formed by ALCVD. In another embodiment, the thickness of the first conductive layer 414 is about 50 Å to 200 Å formed by LPCVD. The first conductive layer 414 has an impurity concentration of about $10^{19}$ to $10^{21}$ ions/cm$^3$. In this embodiment, the impurities are n-type, such as arsenic or phosphorus.

Figure 3B:
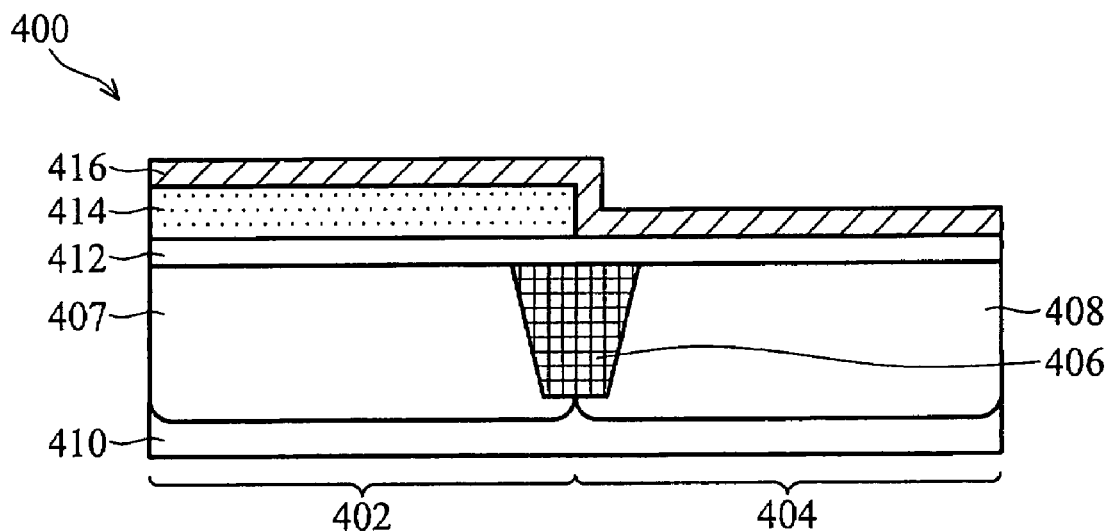

Referring to FIG. 3b, a second conductive layer 416 is blanket formed on the first conductive layer 414 in the NMOS region 402 and the gate dielectric layer 412 in the PMOS region 404, wherein the second conductive layer 416 is an in-situ doped conductive layer. The second conductive layer 416 may comprise silicon, polysilicon or amorphous silicon formed by low pressure CVD (LPCVD), atomic-layer CVD (ALCVD) or other deposition processes in an ambient containing boron and silane at a temperature of about 450□ to 600□. The second conductive layer 416 has an impurity concentration of about $10^{19}$ to $10^{21}$ ions/cm$^3$. In this embodiment, the impurities are p-type, such as boron. The second conductive layer 416 has a thickness of about 3 Å to 300 Å. To avoid possible neutralization of the impurity concentration by the second conductive layer 416, the thickness of the first conductive layer 414 is preferably thicker than the second conductive layer 416, for example, twice as thick as the second conductive layer 416.

Figure 3C:
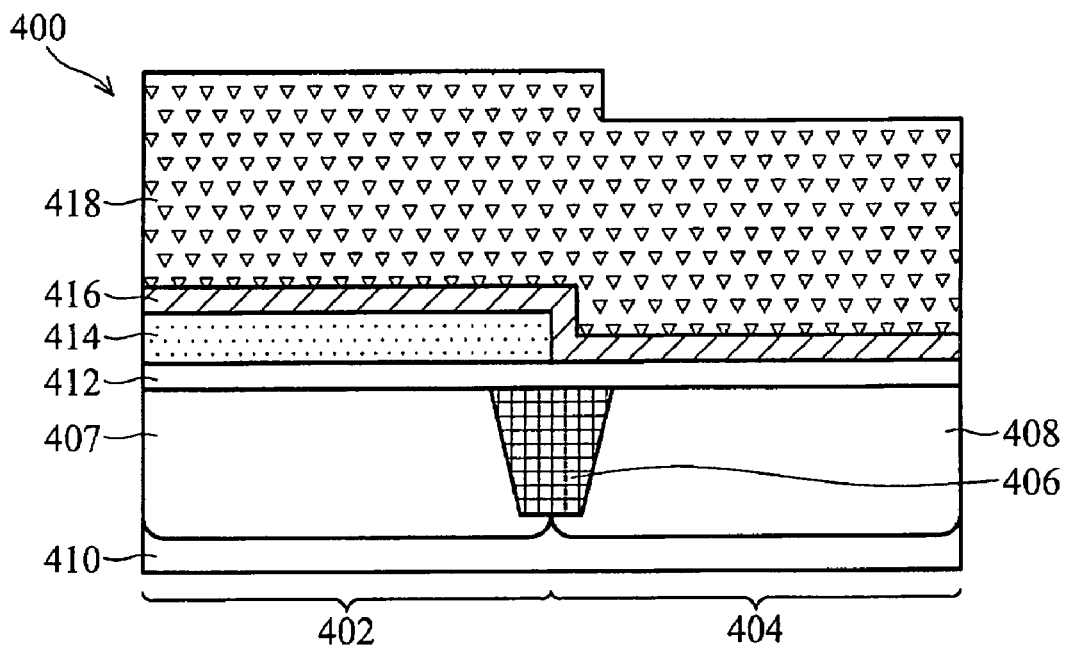

Referring to FIG. 3c, a third conductive layer 418 is blanketly formed on the second conductive layer 416. The third conductive layer 418 may comprise undoped silicon, undoped polysilicon or undoped amorphous silicon formed by low pressure CVD (LPCVD), atomic-layer CVD (ALCVD) or other deposition processes at a temperature of about 450□ to 600□. The third conductive layer 418 may also comprise metal formed by physical vapor deposition (PVD) or other deposition processes. The third conductive layer 418 has a thickness of about 500 Å to 2500 Å.

Figure 3D:
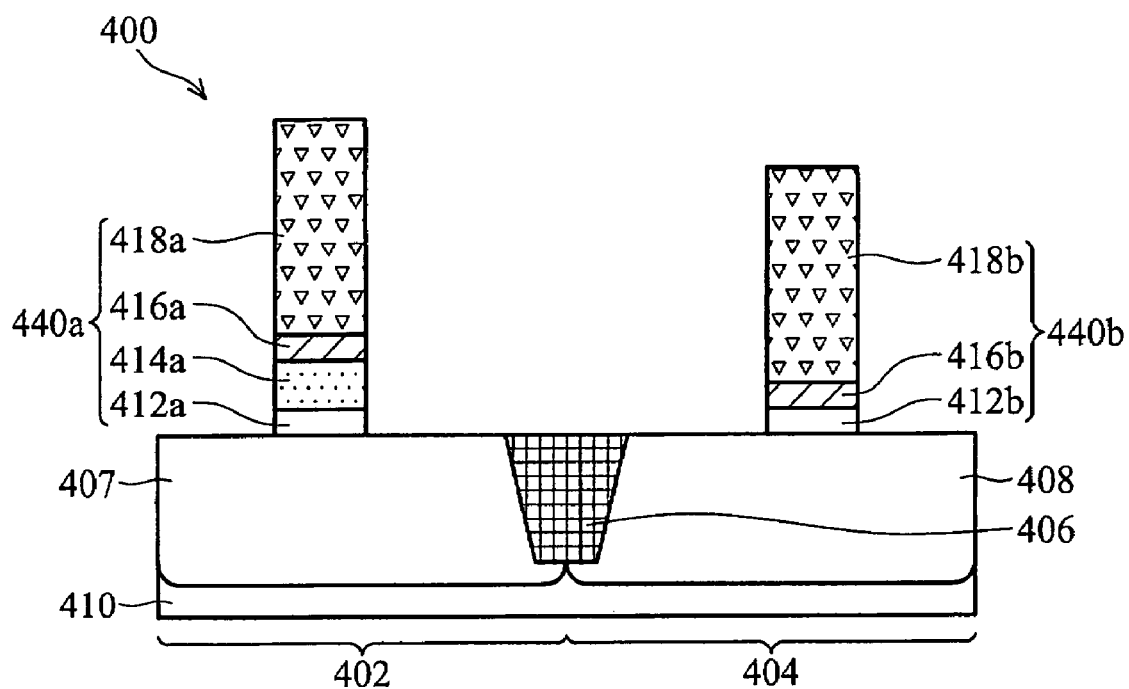

Referring to FIG. 3d, a patterned photoresist (not shown) is formed on the third conductive layer 418 in the NMOS region 402 and the PMOS region 404. The patterned photoresist is used as a mask for a following anisotropic etching process. Then the gate dielectric layer 412, the first conductive layer 414, the second conductive layer 416 and the third conductive layer 418 not covered by the patterned photoresist in the NMOS device region 402 are removed by the anisotropic etching process to leave a patterned gate dielectric layer 412a, a patterned first conductive layer 414a, a patterned second conductive layer 416a and a patterned third conductive layer 418a, which serve as an NMOS gate stack 440a. Also, the gate dielectric layer 412, the second conductive layer 416 and the third conductive layer 418 not covered by the patterned photoresist in the PMOS device region 404 are removed by an anisotropic etching process to leave a patterned gate dielectric layer 412b, a patterned second conductive layer 416b and a patterned third conductive layer 418b, which serve as a PMOS gate stack 440b. Thus, the patterned photoresist is removed.

Figure 3E:
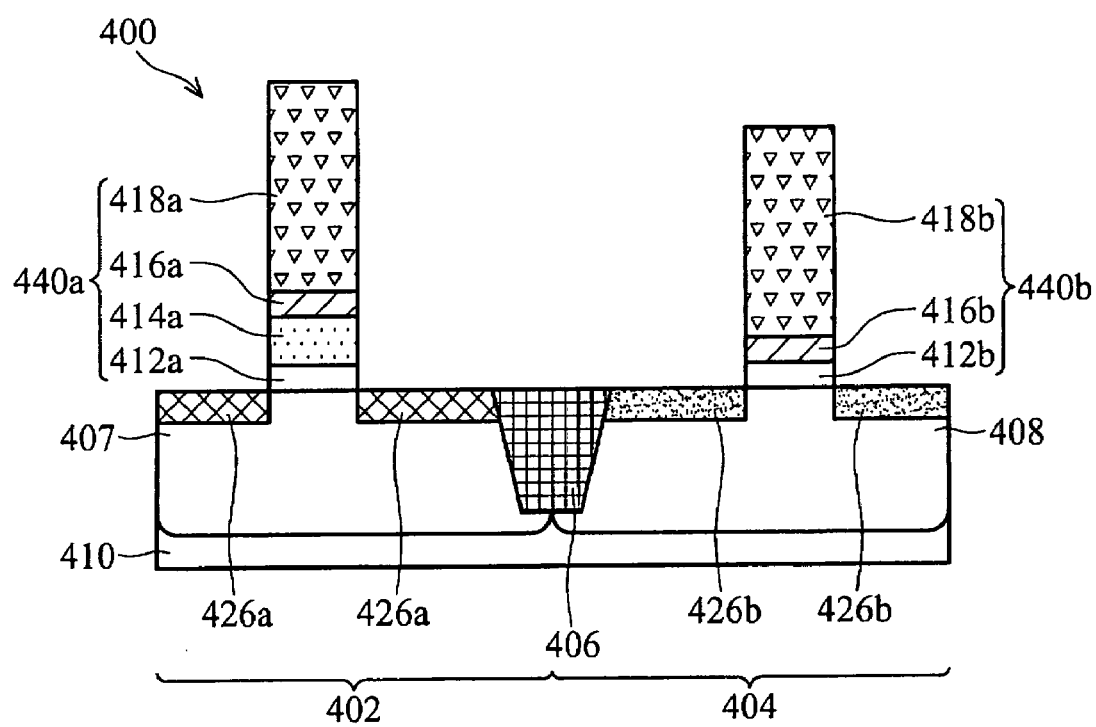

FIG. 3e illustrates the formations of n-type lightly doped source/drain (NLDD) regions 426a and p-type lightly doped source/drain (PLDD) regions 426b. Preferably, NLDD regions 426a are formed by implanting n-type impurities into the NMOS region 402 using the NMOS gate stack 440a as a mask while the PMOS region 404 is masked. The PLDD regions 426b are formed by implanting p-type impurities into the PMOS region 404 using the PMOS gate stack 440b as a mask while the NMOS region 402 is masked. The NLDD regions 426a and PLDD regions 426b are formed in different processes. The process sequences of the formations of NLDD regions 426a and PLDD regions 426b can be switched.

Figure 3F:
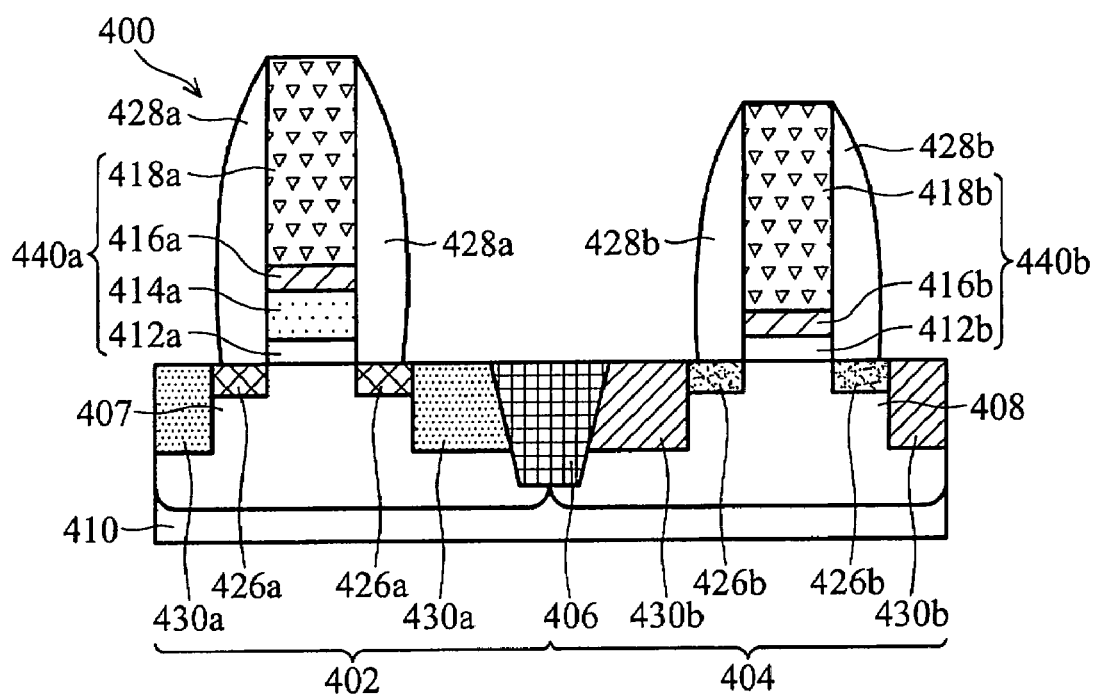

FIG. 3f illustrates fabrication of NMOS spacers 428a and PMOS spacers 428b. The NMOS spacers 428a are formed along sidewalls of the NMOS gate stack 440a in the NMOS region 402. The PMOS spacers 428b are formed along sidewalls of the PMOS gate stack 440b in the PMOS region 404, separately. As is known in the art, spacers 428a and 428b are preferably formed by blanketly depositing a dielectric layer over the entire region followed by etching back the dielectric layer using anisotropic etching such as plasma etching. Plasma etching typically comprises fluorine atoms such as $CHF_3$ or $CF_4$ to precisely control the shape and length of spacers 428a and 428b. NMOS spacers 428a and PMOS spacers 428b may be formed of a single dielectric layer or a composite layer including more than one dielectric layer, for example, a silicon nitride layer on a silicon oxide liner (not shown) by LPCVD. FIG. 3f also illustrates the formation of NMOS source/drain regions 430a and PMOS source/drain regions 430b. Preferably, the NMOS source/drain regions 430a are formed by implanting n-type impurities such as arsenic or phosphorus into the NMOS region 402 using the NMOS gate stack 440a and the NMOS spacers 428a as masks while the PMOS region 404 is masked. At the same time, the third conductive layer 418a in the NMOS region 402 is also doped by implantation of n-type impurities such as arsenic or phosphorus. The NMOS source/drain regions 430a and the third conductive layer 418a in the NMOS region 402 have an impurity concentration of about $10^{18}$ to $10^{21}$ ions/cm$^3$. The PMOS source/drain regions 430b are formed by implanting p-type impurities such as boron into PMOS region 404 using the PMOS gate stack 440b and the PMOS spacers 428b as masks while the NMOS region 402 is masked. At the same time, the third conductive layer 418b in the PMOS region 404 is also doped by implantation of n-type impurities such as boron. The PMOS source/drain regions 430b and the conductive layer 418b in the PMOS region 404 have an impurity concentration of about $10^{18}$ to $10^{21}$ ions/cm$^3$. The NMOS source/drain regions 430a and the PMOS source/drain regions 430b are formed in different processes. The sequence of process steps for forming the NMOS source/drain regions 430a and the PMOS source/drain regions 430b can be switched.

Figure 3G:
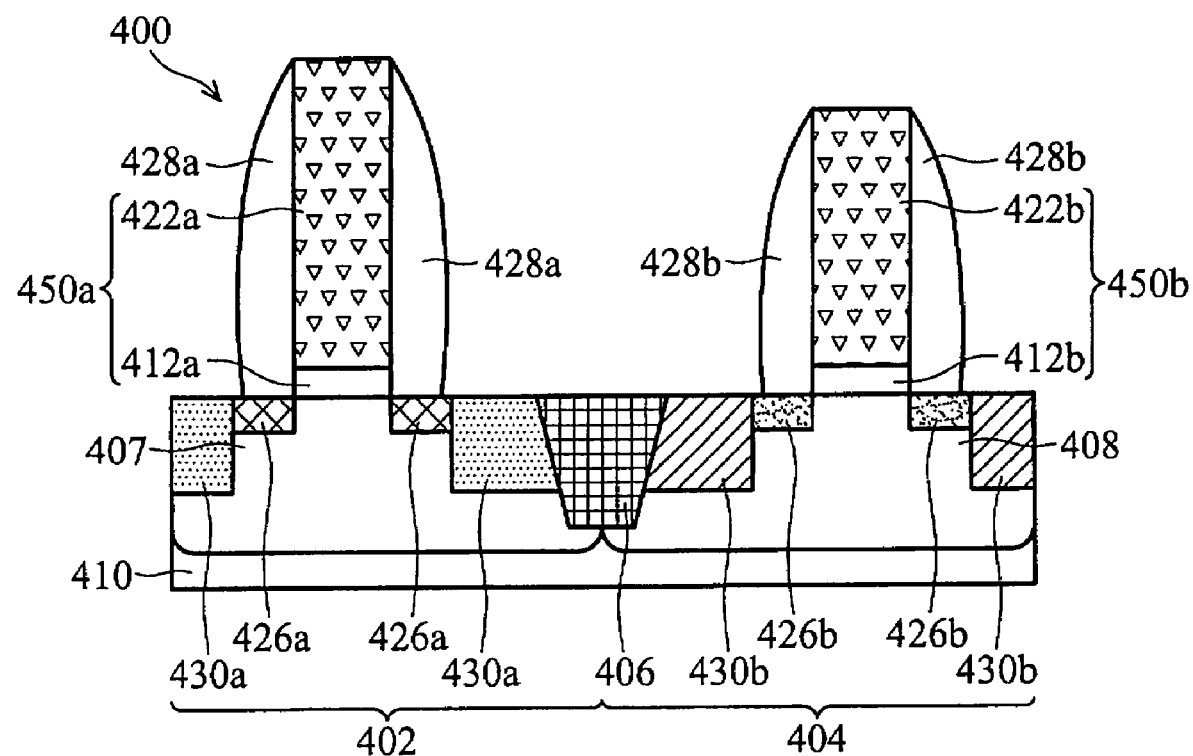

FIG. 3g illustrates an annealing process to form a NMOS gate electrode 422a and a PMOS gate electrode 422b. The annealing process activates the impurities not only in the NMOS source/drain regions 430a, but also in the patterned first conductive layer 414a, a patterned second conductive layer 416a and the patterned third conductive layer 418a to form the NMOS gate electrode 422a in the NMOS region 402. At the same time, the annealing process activates the impurities not only in the PMOS source/drain regions 430b, but also in the patterned second conductive layer 416b and the patterned third conductive layer 418b to form the PMOS gate electrode 422b in the PMOS region 404. Subsequent to the annealing process, the n-type impurities are substantially uniformly distributed in the NMOS gate electrode 422a in the NMOS region 402. The p-type impurities are also substantially uniformly distributed in the PMOS gate electrode 422b in the PMOS region 404. The annealing process is preferably performed at a temperature of about 400° C. or higher. As is known in the art, the annealing process may be performed using thermal annealing, flash annealing, laser annealing, or the like. Thus, the formation of CMOS device 400 is complete.

In the exemplary embodiments, the in-situ doped conductive layer provides a heavier and more uniform doping than the conventional impurity implanted conductive layer. Subsequent to the annealing process, the impurities are more uniformly distributed in the in-situ doped and the doped conductive layers and a gate electrode is finally formed. In NMOS, PMOS or CMOS device fabrication processes, the method for fabricating a gate electrode of the invention can prevent polysilicon gate depletion problems without requiring any additional annealing processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:
   providing a semiconductor substrate;
   forming a gate dielectric layer on the semiconductor substrate;
   forming a first conductive layer directly on the gate dielectric layer, wherein the first conductive layer is an in-situ doped conductive layer;
   forming a second conductive layer directly on the first conductive layer, wherein the second conductive layer is a doped conductive layer with the same type conductivity as the first conductive layer, wherein the first conductive layer has an impurity concentration higher than an impurity concentration of the second conductive layer; and
   patterning the second conductive layer and the first conductive layer to form a gate electrode.

2. The method of fabricating the semiconductor device as claimed in claim 1, wherein the gate dielectric layer has a thickness of about 6 Å to 18 Å.

3. The method of fabricating the semiconductor device as claimed in claim 1, wherein the first conductive layer or the second conductive layer comprises silicon, polysilicon or amorphous silicon.

4. The method of fabricating the semiconductor device as claimed in claim 1, wherein the first conductive layer has a thickness of about 3 Å to 300 Å.

5. The method of fabricating the semiconductor device as claimed in claim 1, wherein the first conductive layer has the impurity concentration of about $10^{19}$ ions/$cm^3$ to $10^{21}$ ions/$cm^3$.

6. The method of fabricating the semiconductor device as claimed in claim 1, wherein the second conductive layer comprises an in-situ doped conductive layer or a conductive layer doped by impurities ion implantation.

7. The method of fabricating the semiconductor device as claimed in claim 1, wherein the second conductive layer has a thickness of about 500 Å to 2500 Å.

8. The method of fabricating the semiconductor device as claimed in claim 1, further comprising:
   performing an annealing process before forming the gate electrode.

9. The method of fabricating the semiconductor device as claimed in claim 1, further comprising:
   forming at least one spacer on sidewalls of the gate electrode.

10. A method of fabricating a CMOS device, comprising:
    forming a gate dielectric layer in a first device region and a second device region in a semiconductor substrate;
    forming a first conductive layer on the gate dielectric layer in the first device region, wherein the first conductive layer is an in-situ doped conductive layer with a first type conductivity;
    forming a third conductive layer over the first conductive layer and the gate dielectric layer in the second device region; and
    patterning the first and the third conductive layer in the first device region to form a first gate electrode; and
    patterning the third conductive layer in the second device region to form a second gate electrode.

11. The method of fabricating the CMOS device as claimed in claim 10, wherein the gate dielectric layer has a thickness of about 6 Å to 18 Å.

12. The method of fabricating the CMOS device as claimed in claim 10, wherein the first conductive layer has a thickness of about 3 Å to 300 Å.

13. The method of fabricating the CMOS device as claimed in claim 10, wherein the third conductive layer comprises a silicon layer doped by n-type or p-type impurities, a polysilicon layer doped by n-type or p-type impurities or a metal layer.

14. The method of fabricating the CMOS device as claimed in claim 10, further comprising:
    forming a second conductive layer on the first conductive layer in the first device region and on the gate dielectric layer in the second device region before blanket forming a third conductive layer, wherein the second conductive layer is an in-situ conductive layer with a second type conductivity.

15. The method of fabricating the CMOS device as claimed in claim 14, wherein the thickness of the first conductive layer is at least twice of the second conductive layer.

16. The method of fabricating the CMOS device as claimed in claim 14, wherein the second type conductivity is opposite to the first type conductivity.

17. The method of fabricating the CMOS device as claimed in claim 10, further comprising:
    implanting the third conductive layer in the first device region with the first type conductivity; and
    implanting the third conductive layer in the second device region with the second type conductivity.

18. The method of fabricating the CMOS device as claimed in claim 17, further comprising:
    performing an annealing process after implanting the third conductive layer.

19. A method of fabricating a semiconductor device, comprising:
    providing a semiconductor substrate;
    forming a gate dielectric layer on the semiconductor substrate;

forming a first conductive layer directly on the gate dielectric layer, wherein the first conductive layer is an in-situ doped conductive layer;

forming a second conductive layer directly on the first conductive layer, wherein the second conductive layer is a doped conductive layer with the same type conductivity as the first conductive layer, wherein the first conductive layer has an impurity concentration higher than an impurity concentration of the second conductive layer; and patterning the second conductive layer and the first conductive layer to form a gate electrode, wherein the second conductive layer has a thickness about 80% of a thickness of the gate electrode.

20. The method of fabricating the semiconductor device as claimed in claim 19, wherein the second conductive layer is an in-situ doped conductive layer.

* * * * *